(12) United States Patent
Ragay et al.

(10) Patent No.: US 9,301,340 B2
(45) Date of Patent: Mar. 29, 2016

(54) IR CONVEYOR FURNACE HAVING SINGLE BELT WITH MULTIPLE INDEPENDENTLY CONTROLLED PROCESSING LANES

(71) Applicants: Peter G. Ragay, La Palma, CA (US); Richard W. Parks, Port Angeles, WA (US); Luis Alejandro Rey Garcia, Long Beach, CA (US)

(72) Inventors: Peter G. Ragay, La Palma, CA (US); Richard W. Parks, Port Angeles, WA (US); Luis Alejandro Rey Garcia, Long Beach, CA (US)

(73) Assignee: TP SOLAR, INC., Paramount, CA (US)

( * ) Notice: Subject to any disclaimer, the term of this patent is extended or adjusted under 35 U.S.C. 154(b) by 414 days.

(21) Appl. No.: 14/030,907

(22) Filed: Sep. 18, 2013

(65) Prior Publication Data
US 2014/0017848 A1    Jan. 16, 2014

Related U.S. Application Data

(63) Continuation-in-part of application No. 12/892,856, filed on Sep. 28, 2010, now Pat. No. 8,571,396, which is a continuation-in-part of application No. 11/768,067, filed on Jun. 25, 2007, now Pat. No. 7,805,064.

(60) Provisional application No. 60/805,856, filed on Jun. 26, 2006.

(51) Int. Cl.
| F26B 13/10 | (2006.01) |
| --- | --- |
| F26B 3/30 | (2006.01) |
| A21B 2/00 | (2006.01) |
| H05B 3/00 | (2006.01) |
| H01L 31/18 | (2006.01) |

(52) U.S. Cl.
CPC .......... *H05B 3/0047* (2013.01); *H01L 31/1876* (2013.01); *H05B 3/0076* (2013.01)

(58) Field of Classification Search
None
See application file for complete search history.

(56) References Cited

U.S. PATENT DOCUMENTS

| 5,740,314 A | 4/1998 | Grimm |
| 6,247,830 B1 | 6/2001 | Winnett et al. |
| 6,301,434 B1 | 10/2001 | McDiamid et al. |

(Continued)

OTHER PUBLICATIONS

20%-Efficient Silicon Solar Cells with Local Contact to the a-Si-Passivated Surfaces by Means of Annealing (COSIMA), Plagwitz, H., et al., Institut fur Solarenergieforschung GmbH, Hamein/Ennmerthal (ISFH), Am Ohrberg 1, D-31860, Emmerthal, DE, Proceedings of 20th European Photovoltaic Solar Energy Conference, Barcelona, Spain, 2005, 4 pages.

*Primary Examiner* — Thor Campbell
(74) *Attorney, Agent, or Firm* — Innovation Law Group, Ltd.; Jacques M. Dulin, Esq.

(57) ABSTRACT

Multi-zone IR solar cell processing furnaces using a single, full-width conveyor belt; selected zones are divided into multiple lanes by upper or/and lower longitudinal divider walls, and heated by high intensity radiation IR lamps backed by a flat plate of ultra-high reflectance ceramic material. Lamp numbers and spacing in each zone/lane can be varied. Power to each lamp, or zone/lane lamp array, both upper and lower, is individually and independently controlled to provide infinite number of temperature profiles in each heating zone/lane. In multi-lane zones the IR lamps are folded, the inner ends being supported by the lane dividers. Lamp external power leads are both accessible from one side of the furnace. The lamp internal filaments include non-radiant and radiant sections arranged so that a pair of radiant sections are aligned in the lamp-folded configuration and disposed over the full width of the solar cell wafers.

20 Claims, 9 Drawing Sheets

(56) References Cited

U.S. PATENT DOCUMENTS

| | | |
|---|---|---|
| 6,310,327 B1 | 10/2001 | Moore et al. |
| 6,376,804 B1 | 4/2002 | Ranish et al. |
| 6,566,630 B2 | 5/2003 | Kitamura |
| 6,849,831 B2 | 2/2005 | Timans et al. |
| 6,903,306 B2 | 6/2005 | Moller |
| 7,915,154 B2 | 3/2011 | Piwczyk |
| 2002/0097205 A1 | 7/2002 | Nakamura |
| 2003/0085216 A1 | 5/2003 | Richert et al. |
| 2005/0136623 A1 | 6/2005 | Tan et al. |
| 2007/0116860 A1 | 5/2007 | Selvamanickam et al. |
| 2010/0220983 A1 | 9/2010 | Doherty et al. |
| 2010/0272544 A1 | 10/2010 | Rivollier et al. |

IR CONVEYOR FURNACE HAVING SINGLE BELT WITH MULTIPLE INDEPENDENTLY CONTROLLED PROCESSING LANES

CROSS-REFERENCE TO RELATED APPLICATIONS

This application is a second CIP Application of U.S. Regular application Ser. No. 12/892,856 filed Sep. 28, 2010 entitled. Rapid Thermal Firing IR Conveyor Furnace Having High Intensity Heating Section, now U.S. Pat. No. 8,571,396 Issued Oct. 29, 2013, which in turn is a CIP of U.S. Regular application Ser. No. 11/768,067 filed Jun. 25, 2007, now U.S. Pat. No. 7,805,064, issued Sep. 28, 2010, entitled Rapid Thermal Firing IR Conveyor Furnace Having High Intensity Heating Section, which in turn is the US Regular Application of U.S. Provisional Application Ser. No. 60/805,856, entitled IR Conveyor Furnace Having High Intensity Heating Section for Thermal Processing of Advanced Materials Including Si-Based Solar Cell Wafers, on Jun. 26, 2006, the disclosures of which are hereby incorporated by reference and the priority of which are hereby claimed under 35 US Code Section 119.

FIELD

This application is directed to improved IR conveyor furnaces, particularly useful for metallization firing of screen-printed, silicon solar cell wafers in which at least one zone, preferably the high intensity firing zone ("spike" zone), is divided longitudinally to form two, independently controllable lanes and to independently controllable firing processes for each lane, that result in higher manufacturing throughput and efficiency of the resulting solar cell photovoltaic elements. The improved furnace configuration system is characterized by a single conveyor belt moving horizontally at a selectable speed through a plurality of zones of an IR furnace from an inlet end to an outlet end, at least one of which zones is divided longitudinally into two, side-by-side zones, each having its own bank of special IR lamps. Each bank of lamps can be independently controlled to provide a unique thermal profile in each of the side-by-side lanes.

BACKGROUND

The fabrication of silicon based solar cells requires a number of specialized processes to occur in a specific order. First, long "sausage-shaped" single crystal masses called ingots, or multi-crystalline blocks are produced, from which thin slices of silicon are cut transversely with "wire saws" to form rough solar cell wafers. Rough wafers are then processed to form smooth wafers in the 150 to 330 micrometer range of thickness. Because of the scarcity of suitable silicon, the current trend is towards making the wafers thinner, typically 180 micrometers thick.

Finished raw wafers are then processed into functioning solar cells, capable of generating electricity by the photovoltaic effect. Wafer processing starts with various cleaning and etching operations, ending in a process called diffusion doping which creates a semi-conducting "p-n", junction diode, the layer that emits electrons upon exposure to sunlight (the normal photon source). These electrons are collected by a fine web of screen printed metal contacts that are sintered into the surface of the cell, as described in more detail below.

To enhance the ability to form low resistance screen-printed metal contacts to the underlying silicon p-n junction emitter layer, additional amounts of phosphorus are deposited onto the front surface of the wafer. The phosphorous is driven into the wafer via a high temperature diffusion process lasting up to 30 minutes. After diffusion and various cleaning and etching processes to remove unwanted semi-conductor junctions from the sides of the wafers, the wafers are coated with an anti-reflective coating, typically silicon nitride ($SiN_3$), generally by plasma-enhanced chemical vapor deposition (PECVD deposited to a thickness of approximately ¼ the wavelength of light of 0.6 microns. After ARC application, the cells exhibit a deep blue surface color. The ARC minimizes the reflection of incident photons having wavelengths around 0.6 microns.

During ARC $SiN_x$ coating PECVD process, hydrogen dissociates and diffuses very rapidly into the silicon wafer. The hydrogen has a serendipitous effect of repairing bulk defects, especially in multi-crystalline material. However, during subsequent IR firing, elevated temperatures (above 400° C.) will cause the hydrogen to diffuse back out of the wafer. Thus, short firing times are necessary to prevent this hydrogen from 'out-gassing' from the wafer. It is best that the hydrogen is captured and retained within the bulk material (especially in the case of multi-crystalline material).

The back of the solar cell is covered with an Al paste coating which is "fired" in an IR furnace to alloy it with the doped silicon, thereby forming a "back surface field". Alternately, the back surface aluminum paste is dried, then the wafer is flipped-over for screen-printing the front surface with silver paste in electrical contact patterns which are also dried. The two materials, back surface aluminum and front surface silver contact pastes are then co-fired in a single firing step which saves one processing step. The back surface aluminum paste melts ("alloys") into a continuous coating, while the front surface paste is sintered at high speed and at high temperature to form smooth, low ohmic resistance conductors on the front surface of the solar cell.

The instant invention is directed to co-firing alloying/sintering processes and IR furnaces for such co-firing or other industrial processes. Currently available IR conveyor furnaces have an elongated, tunnel-like horizontally-oriented heating chamber, divided along its length into a number of zones. Each zone is insulated from the outside environment. Typically, the first zone, just inside the entrance is supplied with a larger number of infra-red (IR) lamps, then the next 2 or 3 zones to rapidly increase the temperature of the incoming silicon wafers to approximately 425° C. to 450° C. This temperature is held for the next few zones to stabilize the wafers' temperature and insure complete burn-out of all organic components of the pastes, to minimize all carbon content within the contacts so as to not increase contact resistance.

Fast firing generally gives optimum results because the impurities do not have time to diffuse into the emitter. A high rate of firing is critical as the activation energy for the impurities to diffuse into the doped Si emitter region is generally lower than that for sintering the silver particles. To achieve this high firing rate, the wafers enter a high IR-intensity "spike" zone where the wafers' temperature is quickly raised into the range of 700-950° C., and then cooled, by a variety of means, until the wafers exit the furnace. The wafers are not held at the peak temperature. Rather, the peak width should be minimal, that is, the dwell time short, while the ascending and descending rate slopes should be steep.

However, in the current state of the IR furnace art these desiderata are not met. Rather, the high intensity spike zone is simply a copy of the first zone wherein IR lamps are arrayed transverse to the longitudinal axis of the furnace zones, i.e., across the full width of the wafer transport belt, both above and below the belt and its support system. As a result, the current art suffers from highly inefficient use of the IR lamps that heat the wafers in the various processing zones, and a shallow excess dwell time characterized by a broad peak and shallow rate temperature curves (slopes) in the spike zone. Currently available furnaces are able to generate in the range of from about 80° C. to about 100° C./second rate of temperature rise in the spike zone. Since the peak temperature must approach 1000° C., the currently available rate of rise at the constant conveyor transport rate requires the spike zone to be physically long since the belt moves at a constant speed. The dwell peak of current processes (dwell time at peak temperature) is also too broad; that is, too long.

The shallow curve/broad peak characteristic process limitation of currently available furnaces has deleterious effects on the metal contacts of the top surface which significantly limits cell efficiency. It is important to accomplish the firing sequence quickly for several reasons. First, the frit glass must not flow too much, otherwise the screen-printed contact lines will flow, widening and thereby reducing the effective collection area by blocking more of the cell surface from incident solar radiation. Secondly, the glass frit should not mix with the silver particles to any great extent since this will increase series resistance of the contacts. Finally, all of this material must etch through the $SiN_x$ anti-reflective (ARC) coating (about 0.15 micrometers in thickness or ¼ of the 0.6 micrometer target wavelength for reflection minimization), but must not continue to drive through the "shallow", doped Si emitter layer, previously formed by the diffusion of phosphorus onto the top surface of the p-type silicon. Emitters are generally 0.1 to 0.5 micrometers in thickness, but shallow emitters are generally in the 0.1 to 0.2 micrometer range.

Thus, to control the etch depth, the sinter must be quenched both quickly and thoroughly. Quenching, that is, preventing diffusion of the silver particles into the silicon below the emitter (forming crystallites) after etching the AR coating and creating good adhesion of the glass to the silicon substrate, must be accomplished by rapid cooling. This is critical. If the silver drives too deep into the doped Si emitter layer, the junction is shorted. The result is that the cell looses efficiency due to a short circuit path for the electrons produced. This is also known as a low shunt resistance property of the cell.

But in contradiction, it is also vitally necessary to slow down rapidity of cooling in order to anneal the glass phase to improve adhesion. Taken together, the cooling curve looks like this: rapid cooling from the peak firing temperature to about 700° C., then slow cooling for annealing purposes, then rapid cooling to allow the wafer to exit the furnace at a temperature low enough to be handled by robotics equipment that must have rubberized suction cups to lift the wafers off the moving conveyor without marring the surface.

Since there are dimensional and IR lamp cost constraints, increasing lamp density in the spike zone is not generally a feasible solution. In addition, the peak temperature is held only for a few seconds at most in the spike zone and the descending thermal profile needs to be sharp. Increasing lamp density can be significantly counter-productive, in that the increased density easily results in a more gradual slope due to the reflection off the product and the internal surfaces of the spike zone.

Likewise, increasing the power to the lamps is not currently feasible because higher output can result in overheating of the lamp elements, particularly the external quartz tubes. When the thermocouples detect temperatures approaching 900° C., they automatically cut back power to the lamps. This results in lower power density, changes in the spectral output of the IR lamp emissions (hence a lower energy output), and results in the need to slow down the conveyor belt speed, thus slowing processing. In turn, this results in a ripple effect into the other zones. Since the belt is continuous, slowing in one zone slows the belt in all zones, so that adjustments must be made in all zones to compensate. In turn, slowing upstream or downstream zones affects the firing zone. Overheating of lamps, e.g., due to thermocouple delay or failure, can cause the lamps to deform, sag and eventually fail. This deformation also affects uniformity of IR output delivered to the product.

There are additional problems presented by the current state of the art furnaces which are solved by the present invention. Factory floor space is at a premium and furnace equipment is expensive so that wafer production facilities are typically single building configurations housing many furnaces arrayed in parallel orientations. Adding a new furnace requires free floor space. An alternative has been to install wider furnaces having conveyor belts on which two or more wafers may be placed side by side. Thus, a furnace with an 18" wide belt can process wafers 2-wide, that is, a double-line or "2-up" furnace, in substantially less floor space than two single line furnaces employing 10" wide belts.

However, the disadvantage is that one size does not fit all. That is, both lines are subject to the same process control parameters, which may result in lower yield, or power output for individual cells, being adjusted for the average of the two lines. Further, uniformity of temperature, and lamellar atmosphere control is adversely affected by increased furnace width. In addition, as furnaces get wider, there is greater occurrence of IR lamp sag failure, as they are unsupported across the furnace at the hottest point.

Finally, different batches of wafers may need to be processed at very different thermal profiles, or across-the-belt thermal variations may result in production wastage in 2-up, wide belt furnaces. With single, full-width lamps, control of each line is not possible in conventional furnaces.

Accordingly, there is an unmet need in the IR furnace and IR firing process art to significantly improve net effective heating rate of conventional lamps, to provide better control and thermal profiles in each wafer lane in the spike zone, to permit improved control of furnace temperature and atmosphere conditions, to improve quenching and annealing profiles, to improve the uniformity of heat in furnace zones, and to improve throughput of such furnaces, while accomplishing these goals on the same or net reduced furnace foot-print. There is an unmet need to provide individual wafer line thermal profile control throughout the zones in double-wide, 2-up furnaces without increasing the furnace width.

THE INVENTION

Summary

Accordingly, the invention is directed to a conveyor or batch-type IR furnace having a plurality of thermal heating zones, including at least one spike peak firing zone, in which at least one zone is longitudinally divided in two to provide two side-by-side wafer processing lanes, each dedicated to a single lane of wafers conveyed therethrough, each lane of which may be individually controlled to provide a unique IR radiation profile in that lane. Broadly, any multi-wafer-width conveyor belt can be divided into individual lanes by providing one or more dividers. Thus a 3-wide belt can be divided into three lanes in the peak firing zone (and/or additional zones) by the use of two dividers, laterally spaced from each other by a width corresponding to the width of the waver, and oriented parallel to the longitudinal center line of the furnace. Accordingly, the invention is directed to both apparatus and method aspects of metallization firing of solar cell wafers in improved continuous tunnel furnaces.

As part of the inventive apparatus and method, each lane is fitted with a plurality of folded IR lamps arrayed transversely across their respective lane, but not extending into the adjacent lane. The folded IR lamps provide a twin, spaced filament, preferably with each filament in its own tube. In a preferred embodiment, the IR lamps comprise a single tube that has been folded in the middle, back on itself in a tight U-shaped configuration, so that the electrical power feeds are side by side on the same side of the furnace. Thus, the IR lamps for Line 1 may be powered from one side of the furnace and for Line 2 from the opposite side. The lane lamps are supported at their inboard end along the center, divider line, of the furnace, but no electrical contacts (ground or power) is required to be installed down the furnace centerline. the result is that the IR lamps of each lane of each zone that has been divided may be individually controlled to provide a different and unique IR and thermal profile, or may be the same in each zone. In addition, the shorter, double lamps are stronger and less prone to warpage or sagging. The shorter length of the double lamps permits them to be operated at the higher voltages necessary to provide the high intensity IR radiation and spectral characteristics needed for rapid and sharp peak firing.

Optionally, the furnace IR heating elements may be backed by ultra high reflectance (on the order of above about 95% IR reflectance) plate-type reflector elements, in distinction to the usual block insulation materials. Optionally, the lamp elements may be laterally isolated by placing them in grooves in the high reflectance backing element. In still another option, air or inert gas may be directed laterally along the channels, between the surface of the grooves and the lamp external surface, to effect cooling of the lamps. The inventive high reflectance backing plate results in effectively up to double the heating rate and furnace processing throughput of advanced materials, such as silicon, selenium, germanium or gallium-based solar cell wafers.

The invention also includes all process control systems that lead to improved solar cell production, and the methods of firing to achieve improved efficiency solar cells as a result of better control of process operations characterized by sharp temperature ascending and descending temperature curves, very sharp peak and precise control of quenching and annealing temperature profiles. The improved control of the invention extends throughout the burn-out, spike, quench, stop-quench and annealing (tempering) zones for improved contact formation, reduction of hydrogen out-gassing, control of the etch depth and improved adhesion, as well as improved efficiency of cell output.

The inventive folded lamp array is implemented by way of example in a longitudinally divided spike zone module having a flat high reflectance plate spaced behind the array of IR lamps. Typically, the folded IR lamps are spaced from each other (exterior to exterior), and the reflector plate is spaced behind (above or below the lamps respectively, for top and bottom lamps in the furnace orientation) in the range of from about 1" to 4", preferably 1"-2.5".

In an option to a flat reflector plate, the plate may be gently laterally rippled, with the ripple width being enough to accommodate the folded lamps, and the ribs of the ripples disposed parallel to the exterior of the lamps. The concave shape of the ripple in which the folded lamp is placed assists in reflectance focusing of the IR radiation onto the face of the wafers. In another option, a plurality of high reflectance elements having parallel deep channels, or deep channels formed in a single high reflectance element, in which shielding ribs are disposed between pairs of adjacent folded lamps, may be used. For most production operations the channels need not be covered with an IR transparent transmission window. Optionally, air introduced transversely across the furnace at or near the lamps may be employed to cool the lamps. In the case of the use of channels, cooling air may be directed in laminar flow along the channels, and exhausted from a center port adjacent the inner end of the folded lamp that is retained in the centerline divider. Alternately, the cooling air direction may be reversed, from the centerline to the sides of the furnace.

The IR lamp heating module may be used singly, located above the furnace conveyor belt to direct the high intensity IR radiation onto the face of the solar cell wafers. Optionally a pair of IR lamp heating modules are used in each zone, disposed facing each other and spaced apart, one above the furnace conveyor belt and one below, to define the product processing zone there-between, each module distinct from other zones in the furnace.

The use of high reflectance element(s), in flat plate, rippled or deep channel configurations in the inventive peak (spike) firing zone permits increasing the power to the lamp to essentially full rating. This results in increase in the heating rate to from about 160° C./sec to about 200° C./sec, that is, effectively doubling the heating rate of conventional 100 watt/inch lamps without resulting in lamp turn down, shut down or deformation. In addition, this permits increasing the conveyor belt speed and thereby the throughput of product and yield. By way of example only, whereas currently available conveyor furnaces operate at conveyor speeds of about 150"/minute, the use of high reflectance elements permits doubling the rate to about 300"/minute, and that increased rate is at spike zone peak temperature in the range of 900° C.±40° C. While some currently available conveyor furnaces claim to be operable at up to about 250"/min, they cannot operate at high power density.

The inventive conveyor furnace comprises a housing or shell forming a chamber insulated with conventional forms of insulation such as fiber, fiber board, or fire brick. The heating module(s) is/are disposed within the outer insulated shell. A multiple-wafer-wide conveyor belt (multi-lane belt) is located between the upper and lower heating modules, and appropriate power and control systems are integrated in the furnace system. The space between the plane of the lamps is the passageway for the conveyor belt carrying the advanced materials substrates being fired. The exemplary processing firing zone described herein functions as a spike zone. In this embodiment, the conveyor belt is a 2-wafer-wide belt, and the spike firing zone is longitudinally fitted with a divider along the centerline to provide two side-by-side lanes, each of which may be independently controlled, as each is heated by the inventive folded lamps described above. The center divider may be provided only in the upper half of the zone, or may be provided in both the upper and lower half.

It also should be understood that a plurality of furnace zones, up to all zones, may include a center divider so that the single conveyor belt is configured into multiple side-by-side lanes in a plurality of zones. In addition, more than one zone may be fitted with either or both the folded lamps and the high reflectance elements, above the belt, below the belt or both. That is, the inventive furnace may be configured as a hybrid of full-width lamps over or under or both over and under the multi-wafer-width belt in some zones, in combination with use of folded, half-width double lamps in one or more zones in which zones, upper, lower or both, are divided along a centerline to form individual lanes. Thus, for example, in a multi-wafer-width conveyor furnace, the burn out section or zone is configured with full-width lamps above and below the belt and there is no center line divider, the spike firing zone module may be configured with center line divider in the upper or/and lower portions and use the folded IR lamps, the quench zone has no lamps and the center divider is optional, the quench stop zone includes full width lamps in the upper section and no lamps in the lower section, and the cool-down, tempering and anneal section only optionally may include full width lamps in the upper section.

Radiant energy from the upper and/or lower infra-red lamps is directed or focused (in case of use of rippled or grooved surface configuration) by the high reflectance elements, preferably formed from machined or cast high grade, white alumina ceramic material, into the process heating tunnel throughout the entire process zone (burn-out, spike and quench/stop zones) to provide a very intense heating environment. The spike firing zone will generally operate in the range of 700° C. to 1000° C.

Lamp power, top and bottom, may be adjusted independently or in groups to achieve precise temperature gradient control in each zone, and where the conveyor belt width is divided, in individual lanes. Temperature control may be effected using either thermocouple-based temperature regulation or voltage-controlled power regulation. Regulation by voltage-controlled power is preferred, as it gives the fastest heating rates and more consistent heating results due to maintenance of stable lamp power, and repeatable, definable, and constant spectral output at all times. That is in contract to fluctuating lamp outputs in response to PID control system(s) that are typically used to for temperature maintenance functionality.

In an important aspect of the invention, the process of the invention includes operationally configuring the power, cooling systems (cooling air flow rate, amount and flow paths, and heat exchange parameters) and belt speed, not only to control zones or lanes in selected zones separately from each other, but also to control individual lamps, to achieve a wide range of thermal profiles longitudinally along the materials process flow path throughout the various zones to produce solar cells with significantly improved performance and efficiencies.

To control the etch depth, the sinter developed in the spike firing zone must be quenched both quickly and thoroughly. Quenching, that is, preventing diffusion of the silver particles into the silicon below the emitter (forming crystallites) after etching the AR coating and creating good adhesion of the glass to the silicon substrate, must be accomplished by rapid cooling. This is critical. If the silver drives too deep into the doped Si emitter layer, the junction is shorted. The result is that the cell looses efficiency due to a short circuit path for the electrons produced. This is also known as a low shunt resistance property of the cell.

This quenching is accomplished in a quench zone characterized by the use of an air knife assembly that uses carefully controlled compressed air volumes with planes of air directed at the top and/or the bottom of the wafer to quickly drop the temperature from the peak zone firing temperature range of from about 800° C. to about 1000° C., to within the range of from about 500° C. to 700° C., typically a drop of 200° C.-400° C. within a second or two.

In addition, it is also vitally necessary to slow or stop the rapid cooling that is produced in the quench zone in order to anneal the glass phase to improve adhesion. This is accomplished in an optional, stop-quench zone immediately following the quench zone. This zone includes a limited number of lamps, typically full conveyor-belt-width lamps only above the contact face of the wafers, but may optionally include lamps below the wafers. The use of these lamps stops the rapid cooling, stabilizes the temperature into the range of 450° C.-700° C. so that slow, tempering cooling can be provided in the subsequent, downstream annealing zone from about 450° C.-700° C. down to a temperature in the range of from about 30° C.-100° C. at the exit end of the furnace. Optionally, and preferably, cooling air is introduced into this stop-quench zone to improve control of the temperature profile. That is, it is important to control the cooling air and lamps so that there is little or no cooling overshoot, followed by a bounce-back (a curve generally shaped like the mathematical square-root operation symbol, √) in the annealing zone. The result of the control of lamp power and air in the three zones: peak, quench and stop-quench is a sharp ascending and descending peak with short dwell (on the order of a second or two) and smooth curve transition into the annealing zone downstream of the stop-quench zone. In multi-wafer-wide belts, where (a) center line divider(s) is/are used to create two or more lanes in the peak firing zone, the dividers may be extended into the quench and stop-quench zone so that there is precise control of those process steps where the temperatures are different in the respective lanes in the peak firing zone. While the tempering/annealing tends to be less sensitive and ordinarily there is no need for the divider(s), they may be used as needed for a particular process temperature profile.

The wafer temperature is maintained in the annealing section for tempering to improve adhesion in the range of below 450° C.-700° C.; near the exit the wafers are cooled further to on the order of 30° C.-100° C. to permit robotic pickers or other handling equipment or personnel to remove the wafers from the conveyor belt and/or from/to a marshalling table to which they are transferred off the belt.

Taken together, the temperature can be carefully controlled in each lane independently to any selected and configured temperature profile of a subject process having both heating and cooling rates in the range of from about 80° C. to 200° C. per second. The resulting controlled temperature profile curves in the firing and downstream zones generally look like this: rapid heating beginning from the temperature at the burnout zone exit of from about 400° C.-600° C. up to a sharp, well defined peak temperature in the firing zone of from about 850° C.-950° C., followed by rapid cooling from the peak firing temperature down to about 400° C.-500° C. as a result of the quench step in the quench zone. The total time of this rapid ramp-up heating and ramp-down cooling is on the order of 1-2 seconds. The stop quench step is typically followed by slow cooling for annealing purposes, and final cooling to allow the wafer to exit the furnace at a temperature low enough to be handled by robotic equipment. The slow controlled anneal cooling is optional. The time at peak temperature, called the peak dwell time, is less than 1 second. The sharpness of the peak profile, can be controlled and is made possible by the ability to control the cooling, as well as selectively program the belt speed, the power to individual lamps in the peak zone and the cooling in downstream zones, particularly in the quench and stop-quench zones as described above. The inventive furnace system controller is configurable for all zones, and for the separate lanes in those zones utilizing one or more divider(s) to create lane(s) on a multi-wafer-wide conveyor belt, as needed to provide a pre-selected thermal profile for the particular product being fired.

In addition, as improvements in lamp design or materials and paste compositions (both front contact paste and back field past) become available in the future, the inventive individual lane control will easily accommodate such advances in the art to provide both improved processes and more efficient cells

BRIEF DESCRIPTION OF THE DRAWINGS

The invention is described in more detail with reference to the drawings, in which.

DETAILED DESCRIPTION OF THE INVENTION

The following detailed description illustrates the invention by way of example, not by way of limitation of the scope, equivalents or principles of the invention. This description will clearly enable one skilled in the art to make and use the invention, and describes several embodiments, adaptations, variations, alternatives and uses of the invention.

In this regard, the invention is illustrated in the several figures, and is of sufficient complexity that the many parts, interrelationships, and sub-combinations thereof simply cannot be fully illustrated in a single patent-type drawing. For clarity and conciseness, several of the drawings show in schematic, or omit, parts that are not essential in that drawing to a description of a particular feature, aspect or principle of the invention being disclosed. For example, the various electrical and pneumatic connections to lights, brakes and lift bellows, being conventional to those skilled in this art, are not shown. Thus, one feature may be shown in one drawing, and another feature will be called out in another drawing.

Figure 1A:
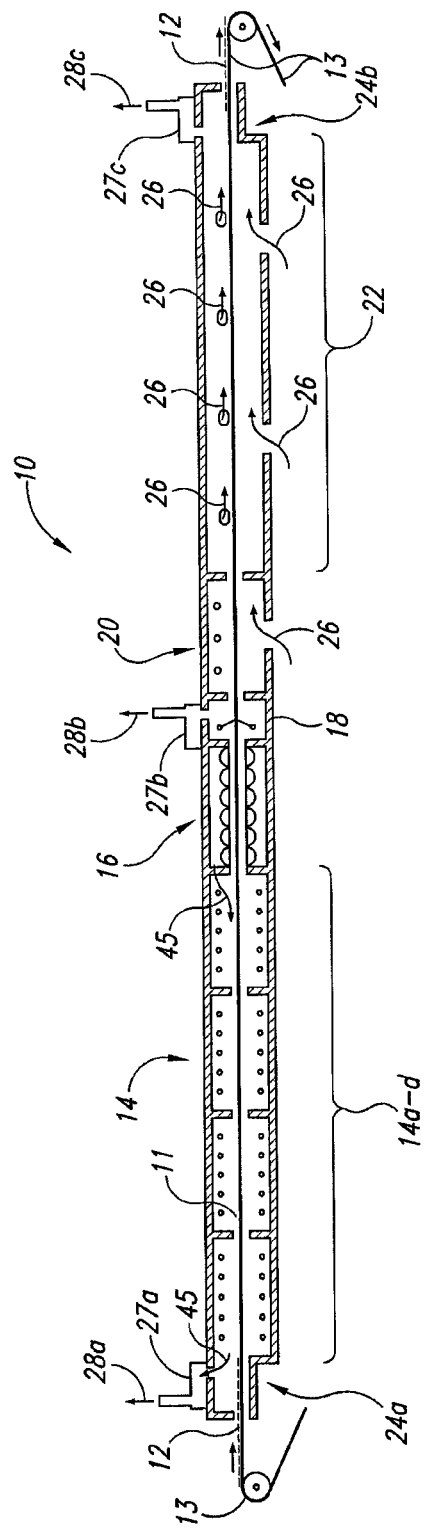
FIG. 1 is series of four side elevation line drawings showing, first in FIG. 1A, a schematic side elevation of the inventive furnace employing at least one high reflectance peak firing zone downstream of a burn-out zone, followed by a quench zone, a stop-quench zone and an annealing zone.
FIG. 1B is a vertical section view through the burn-out zone.
FIG. 1C is a vertical section view through the peak firing zone employing grooved reflective elements in a first embodiment, the quench zone and the stop quench zone as well as the transition into the annealing zone.
FIG. 1D is a vertical section view through the annealing zone.

FIG. 1A illustrates schematically a conveyor furnace 10 comprising a conveyor belt 13 transporting doped solar cell wafers 12 through a process zone 11 that is continuous through a plurality of furnace process modules or sections, including: a burn-out section 14; followed by a peak firing section 16; downstream of which, in sequence are a quench section 18; a stop-quench section 20; and a tempering or annealing section 22, the latter employing air and/or water cooling. The respective process zone portion in each furnace section takes the name of that section; thus, burn-out, peak; quench, stop-quench and anneal "zones" refers both to the process volume through which the conveyor belt traverses as well as the furnace hardware of that section.

The conveyor belt 13, shown schematically, moves left to right and defines the horizontal centerline (above it are the upper modules and below it are the lower modules of the sections or zones) as well as the longitudinal direction; thus, orthogonal to the belt travel is defined as the lateral direction or dimension. No product is shown in FIG. 1 in the process zones 14, 16, 18, and 22 due to the scale of the drawing. Entrance and optional exit baffles 24a, 24b are disposed at the entry and exit ends of the furnace, respectively. Typically there is an upstream dryer, not shown. Intermediate baffles, e.g., between zones 16 and 18, may be provided.

The burn-out section includes a plurality of three or four heating modules 14a-14d, and the firing section includes one or more spike zone modules 16. Note that the burn-out, peak, and stop-quench modules can be the high reflectance element type IR lamp heating modules, or just the spike zone module(s) 16 can employ the high reflectance alumina plate plus the folded tube type IR lamps 38.

Figure 1B:
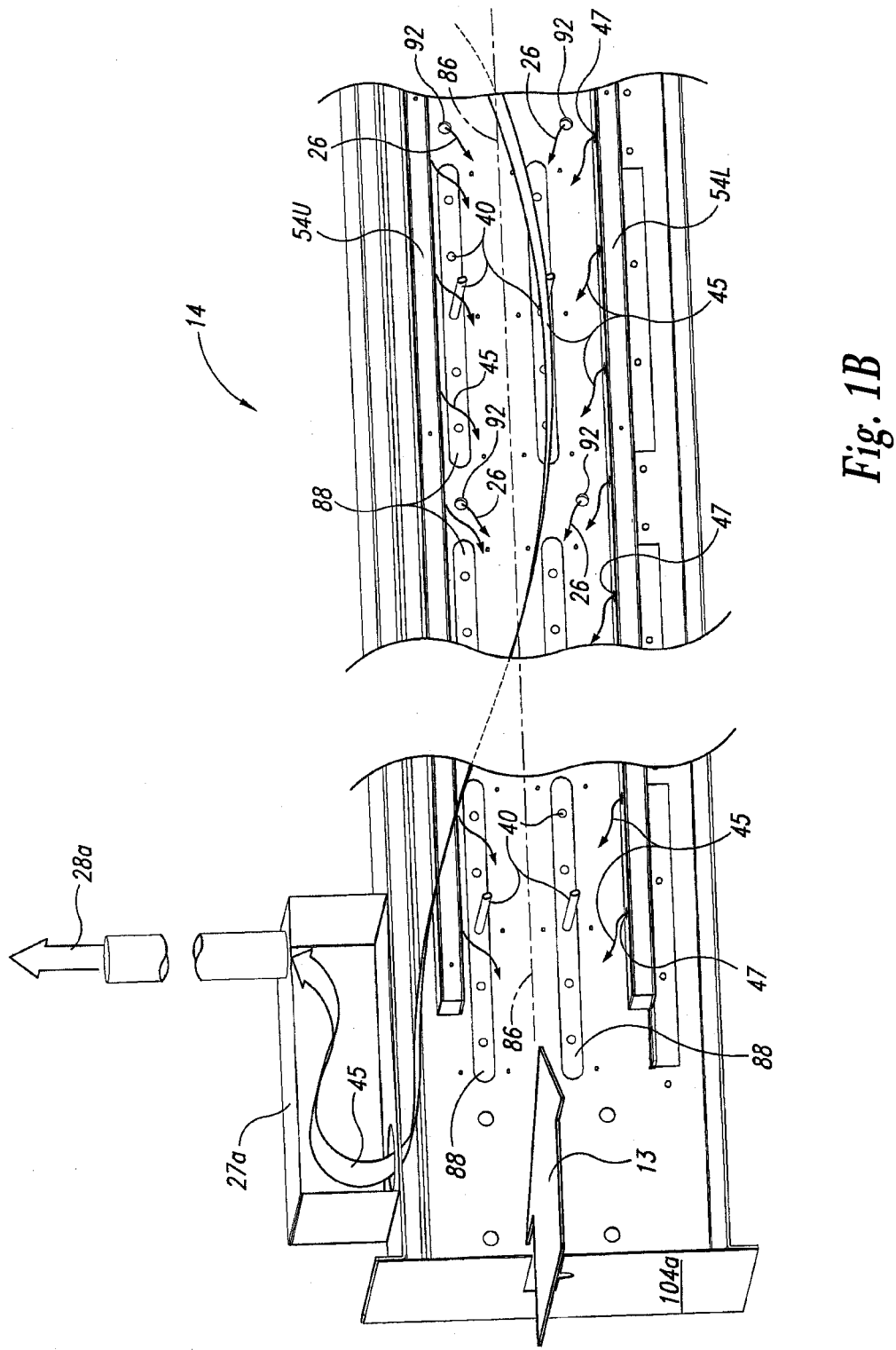
Figure 1C:
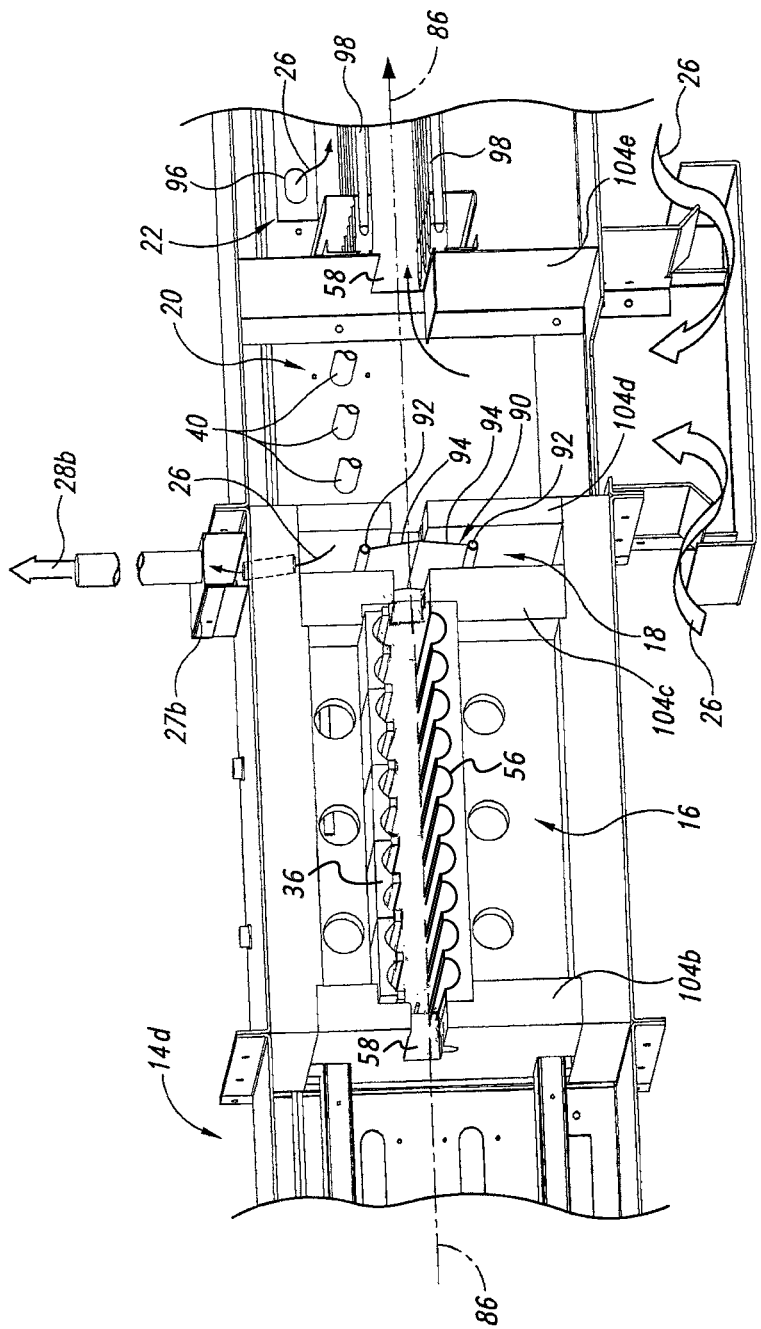
Figure 1D:
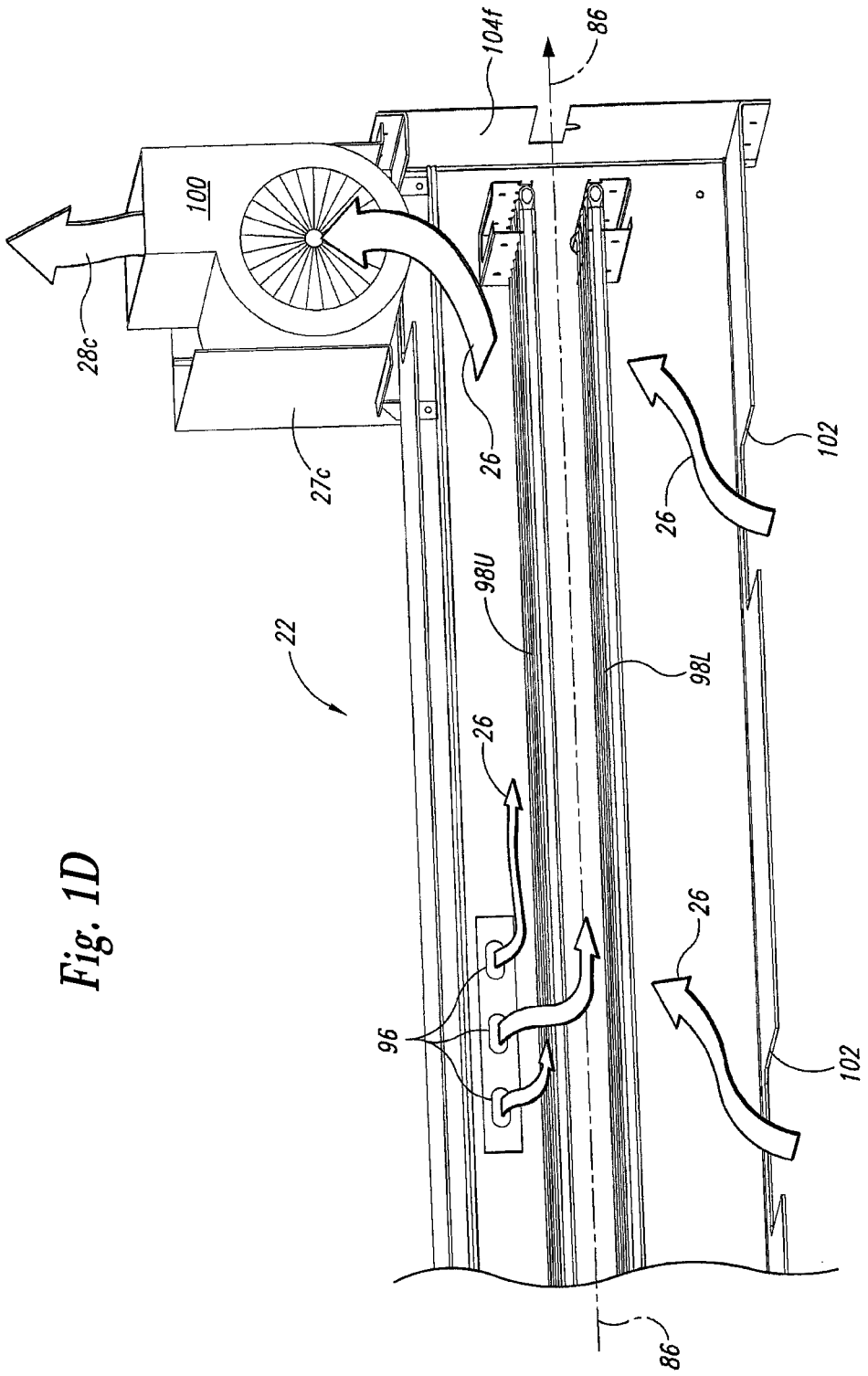

FIGS. 1A and 1B also show the recycle, for greatly improved energy efficiency, of hot air 45 from the spike zone high reflectance alumina plate element module 16 back upstream into the burn-out zone 14. The air exits via plenum 27a as exhaust air 28a out the flue at the upstream end of the furnace. In addition, air injected in the quench zone 18 exhausts via plenum 27b as exhaust air 28b. FIGS. 1B and 1C show that ambient cooling air 26, introduced from the bottom in stop-quench zone 20 and introduced from the bottom and/or sides of the annealing zone 22, permits control of the temperature profile in those zones. Note in FIG. 1C, cooling air 26 introduced in the bottom of the stop-quench zone 20 exits via the conveyor belt gap 58 in the zone divider wall 104e between that zone and the annealing zone 22. Alternately, the stop-quench zone 20 can be separately vented by its own flue (not shown). In the annealing zone 22, as best seen in FIG. 1D, a heat exchange system, e.g., water pipe manifold may be used to assist cooling (in addition to the cooling air 26). The cooling air 26 exits zone 22 via plenum 27c as exhaust air 28c.

Turning now in more detail to FIG. 1B, this shows in longitudinal section the left side of the burn-out zone (the right side is symmetrically the same) having an entry in the left hand zone divider wall 104a for the conveyor belt 13, which is shown schematically as a wide, flat arrow. The conveyor belt path is shown by the conveyor center line 86 as it traverses the zone toward the right. Above and below the belt are ports 88 for insertion of lamps 40 shown schematically as partial tubes and axis position dots in the figure so as to not obscure the air flow feature. Upper and lower heat recycle manifolds 54U and 54L, which may be optional, have spaced apertures 47 for exhaust of hot air 45 from the downstream peak zone, best seen in FIG. 2. In addition, compressed air or inert gas 26 may be injected through lines 92 to assist in temperature control and exhaust of burned-out volatiles and smoke. This hot recycle air and control gas forms a generally laminar stream, as shown by the large ribbon 45 extending from right to upper left, where it exhausts out the flue manifold 27a and the flue pipe as exhaust air 28a.

Figure 6:
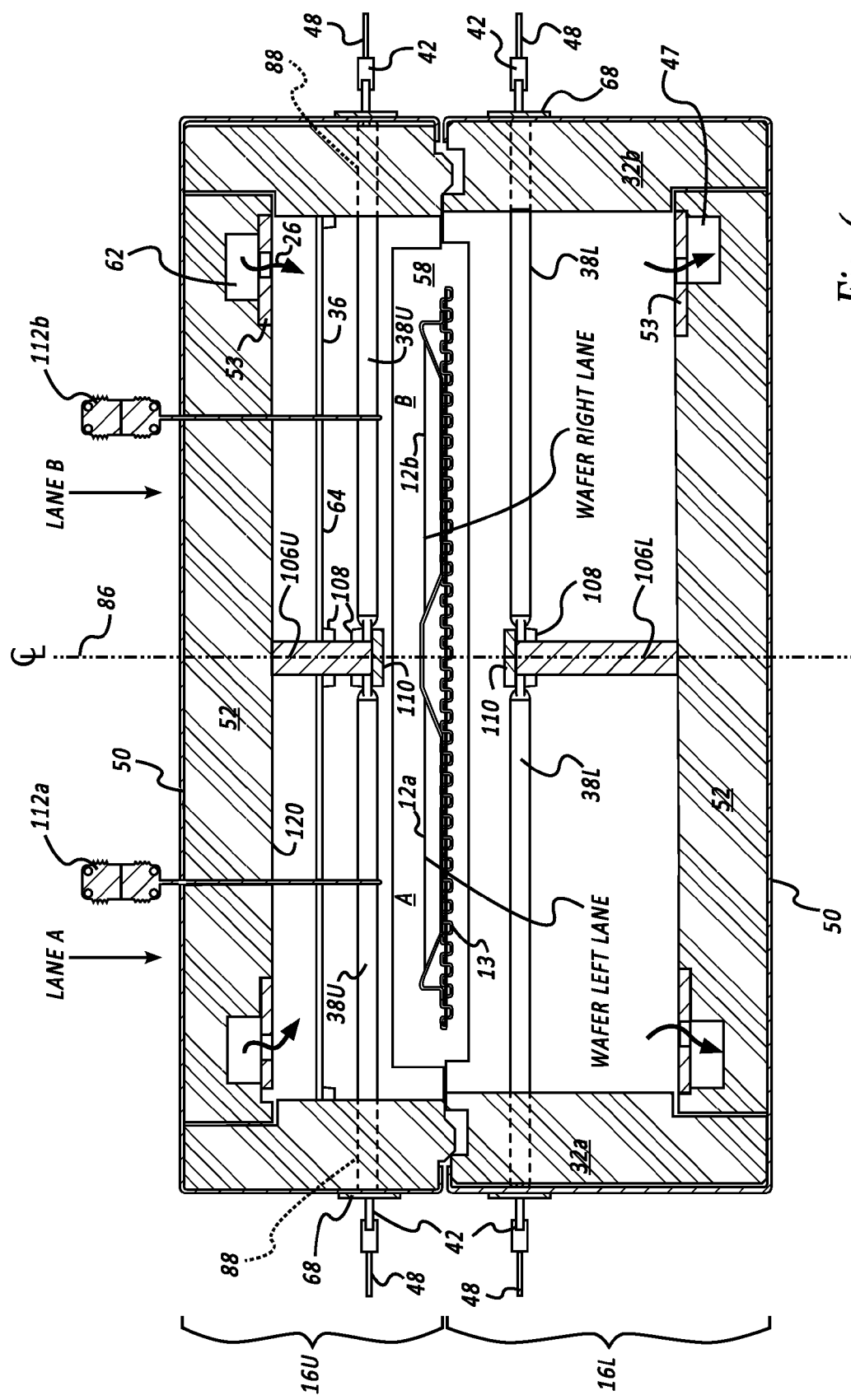
FIG. 6 is a transverse section view through a furnace of this invention showing the use of both upper and lower lane dividers and using folded IR lamps both above and below the conveyor belt.

FIG. 1C continues downstream from the right end of the burn-out zone 14d, shown on the left, to the left end of the annealing zone 22, beginning rightward of the zone divider wall 104e, shown on the right. As before, the centerline of the conveyor belt is shown as 86. Exiting the burn-out zone 14d through slot 58 in zone divider wall 104b, the belt 13, carrying product cell wafers 12 (not shown for clarity) in process zone 11, enters the high reflectance element peak firing zone 16, which is shown in detail in FIGS. 2, 3 and 6. In this FIG. 1C, being a section view along a vertical plane just to the left of the center line, does not show a longitudinal divider; that is shown in FIGS. 3 and 6.

Continuing with FIG. 1C, the IR lamps (not shown), backed by the high reflectance element(s) 36 of the peak firing zone, here shown in an optional deep channel configuration, raises the temperature of the product wafers rapidly from the burn-out temperature, typically in the range of 400° C.-600° C., preferably 450° C.-500° C., to the selected peak temperature for melting the silver of the contact lines printed on the upper surface and sintering the flux and alloying the back side paste. The peak temperature is selected based on the properties of the contact and back paste compositions.

The high reflectance alumina element peak zone modules permit rapid firing of the solar cell wafers typically into the range of from about 750° C. to about 950° C. at rates in a range in excess of 80° C./sec to up to about 200° C./sec, preferably in the range of above about 100° C./sec to about 160° C./sec. That firing rate is on the order of twice the current furnace capacity, and permits heating rates at up to the maximum lamp power rating without undue lamp failure, while providing on the order of 2× greater throughput of solar cells with greater operating efficiencies. The high reflectance element(s) IR lamp module thus provides a high rate of temperature increase slope which prevents excess degassing of Hydrogen from the substrate cell. The lamps in this peak firing zone can be powered in sub-sets, or individually power-programmed so that the peak temperature is reached near the exit zone divider wall 104c.

The peak zone terminates in zone divider wall 104c, and the belt with product immediately enters the quench zone 18, defined between wall 104c and wall 104d. A compressed air or inert gas knife assembly 90 comprises lateral spaced compressed air tubes 92 having slits therein that form and direct a plane of air 94 onto the wafer product on the belt. This drops the temperature very quickly by several hundred degrees Centigrade, preventing the etch-through of the molten silver contacts into the doped emitter layer. The cooling curve slope is equally steep, thus permitting control of the width of the temperature curve peak, that is, the dwell at the contact melt and sinter formation temperature. Together, the lamp power control in the high reflectance element peak zone and the rapid, controlled quenching, permits precise control of this critical peak dwell process step.

The cooling air, after exiting the knife, becomes heated and exhausts out flue plenum and stack 27b as hot air 28b independent of other air streams. For a given conveyor speed and length of the quench zone between zone walls 104c and 104d, the compressed air temperature and volume are controllable to provide any pre-selected amount of cooling for a particular industrial process. Temperature drops of 400° C. to 600° C. within a few seconds is entirely within the capability of the inventive furnace.

To insure there is no overcooling, also called "overshoot", the quench is stopped in optional stop-quench zone 20 by a combination of IR lamps 40, and optional auxiliary cooling air 26 entering via baffles from below. As in other lamp zones, the power to these lamps may be easily controlled to provide any level of heat, so that the curve transitions smoothly to the annealing temperature required in following zone 22, to temper and promote good adhesion. That takes place in the annealing zone 22, just downstream (to the right in this figure) of zone divider 104e. Note the slot 58 between the stop-quench and anneal zone is large, permitting the air to flow without turbulence into the down-stream zone 22.

FIG. 1D illustrates the features of annealing zone 22, in which the solar cell wafers are held at a pre-selected temperature for a time period adequate to promote adhesion, and then cooled for offloading downstream of the zone exit wall 104f. The temperature profile in this zone is selectively controlled by a combination of inlet air 26, introduced through bottom inlets 102, and/or through side wall ports 96. The air heats up as it cools the wafer substrates and is exhausted out plenum 27c as hot exhaust air 28c, and this may be controlled and assisted by use of an ID fan 100. Optionally, water cooled heat exchange lines 98U and/or 98L may be used to effect further cooling.

Two examples of metallization furnaces for preparation of photovoltaic cells are shown in Table 1, below, one without a dryer section, Example 1, and one with a dryer section, Example 2.

TABLE 1

Metallization Firing Furnace Configurations

| | Example 1 - No Dryer | Example 2 - With Dryer |
|---|---|---|
| Process Furnace Configuration | | |
| Parts Clearance (belt-to-upper-window) | 20 mm | 20 mm |
| Entrance Baffle, 24a | 200 mm | 200 mm |
| Heated Length 14, 16 | 2000 mm | 2000 mm |
| Number of Heated Process Zones 14, 16 | 5-6 | 5-6 |
| Rapid Cooling Quench/Stop Zones 18/20 | 250 mm | 250 mm |
| Cooling Air (in 22) | 1185 mm | 1185 mm |
| Cooling Heat Exchange (in 22) | 1185 mm | 1185 mm |
| Max. Operating Temp. in Peak Zone, 16 | 1000° C. | 1000° C. |
| Dryer (Inline) Upstream | | |
| Entrance Baffle | — | 200 mm |
| Heated Length | — | 2,800 mm |
| Exit Baffle | — | 200 mm |
| Gap (between Dryer/Furnace) | — | 400 mm |
| Number of Dryer Zones | — | 3 |
| Maximum Operating Temperature | — | 500° C. |
| Electrical/Facilities | | |
| Process Exhaust, Venturi | 2 | 4 |
| Power (Kw) Peak - Typical | 84-35 Kw | 126-48 Kw |
| Clean Dry Air (CDA) @ 75 PSI | 614 LPM/1,300 SCFH | 800 LMP/1,700 SCHF |
| Belt Width, 13 | 250 mm | 250 mm |
| Speed of Conveyor, 13 | 650 cm/min. | 650 cm/min. |
| Load/Unload Station | 600 mm/1000 mm | 600 mm/1000 mm |
| Overall Length/Width | 6,400 mm/900 mm | 9,800 mm/900 mm |
| Wafer 125 × 125 mm @ 650 cm/min. | 3,000 wafer/hour | 3,000 wafer/hour |
| Wafer 156 × 156 mm @ 650 cm/min. | 2,420 wafer/hour | 2420 wafer/hour |

Figure 2:
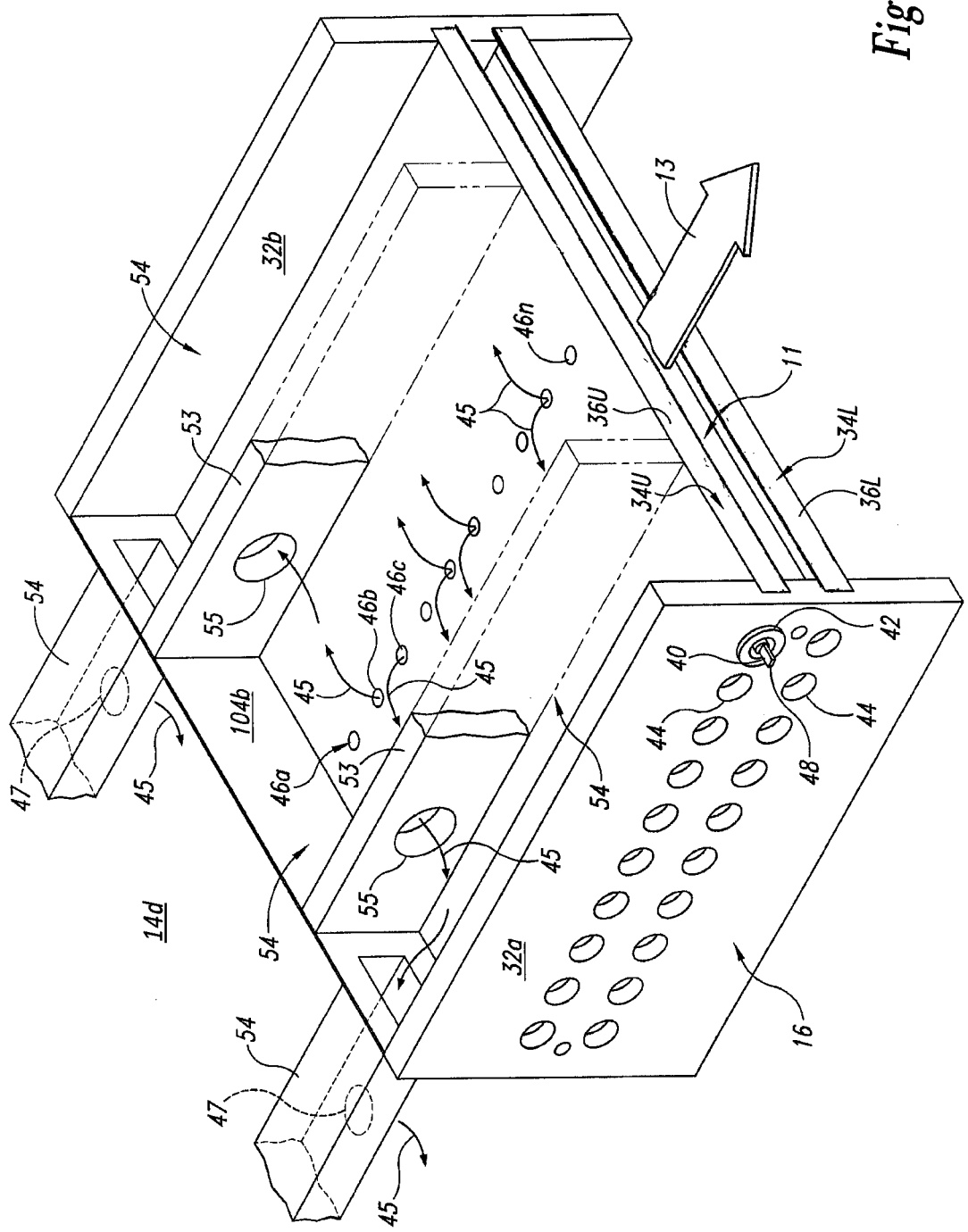
FIG. 2 is a schematic isometric view of an exemplary peak heating zone employing the high reflectance element modules, top and bottom and showing recycle to the burn-out zone.
Figure 3:
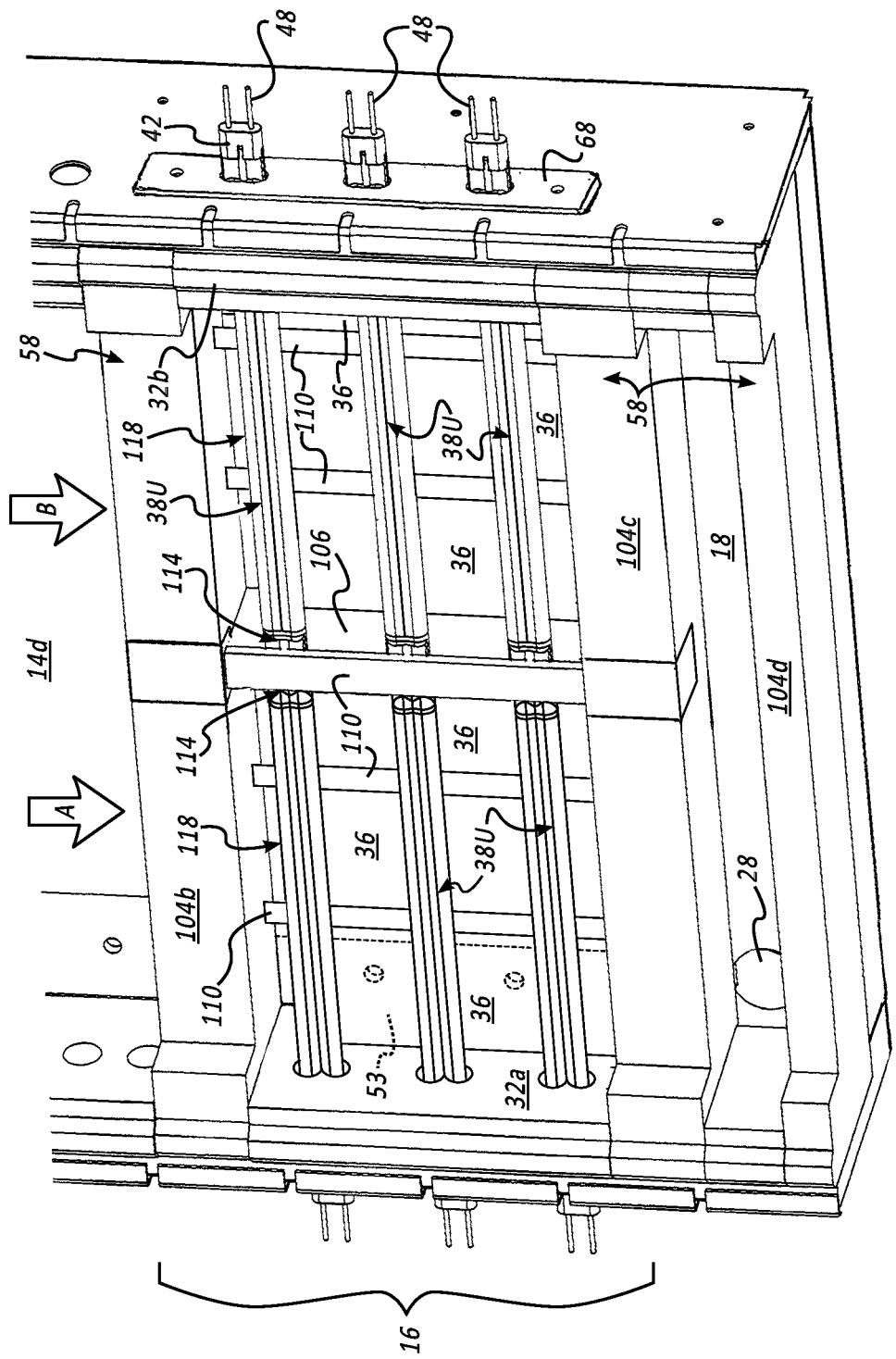
FIG. 3 is an isometric view of the interior of a furnace module, in this view looking up at the upper portion of a peak firing zone illustrating the inventive lane divider and separate, independently controllable arrays of folded high intensity IR lamps for each of Lanes A and B.

FIG. 2 shows in simplified detail an exemplary high intensity IR lamp heating module employing flat-surface high reflectance elements 36U and 36L for the spike zone 16 firing of the cells 12. The path and direction of the conveyor belt 13 in the process zone 11 is shown by the arrow. The process zone is defined between upper and lower high reflectance heating element (IR lamp) modules 34U, 34L, respectively, which are retained in place by grooves in the side walls 32a, 32b, as shown. The heating modules comprise high reflectance flat plate elements 36U, 36L (which optionally may include ripples or channels formed therein, disposed respectively above and below the upper and lower IR heat lamp tubes 40. The lamps 40 are retained laterally by a ceramic centering and retaining fitting 42 that is received in bore 44 in the respective side walls 32a, 32b. A series of optional exhaust holes 46a-46n, one for each lamp (or channel if used), are provided for exhaust of the now hot cooling air or gas. In this embodiment the exhaust holes or ports 46 are centered along the longitudinal axis of the heating module to permit cooling air 45 to exhaust laterally through holes 55 in spaced longitudinal baffles 53, and thence back upstream via conduits 54, as shown by the sequence of arrows. The conduits include spaced holes 47 there-along to direct the heated air 45 back upstream into the burn-out zone as shown in FIG. 1. This recycle of the air, heated in between the spike zone lamps, back upstream into the burn-out zone is a substantial heat exchange and energy saving feature of the invention.

An electrical connector for each lamp is shown at 48. Above the upper and lower high reflectance element plates 36U, 36L are disposed refractory insulation, typically, a commercially available ceramic fiber board, not shown in this view. This module fits in the furnace shell 50 at the appropriate location to form one of the process zone sections, either a burn out section 14a-14d, or a firing section, 16, such as a spike zone, or a stop-quench zone module 20. FIG. 2 illustrates the use of full conveyor belt-width single IR lamp tubes, and accordingly illustrate a furnace module for the case of a conveyor belt transporting wafers one-wide or two or more wide in multiple lanes, but where the thermal profile in all the lanes is the same. That is, the full width lamps do no permit individual lane by lane different thermal profile controls. That feature is illustrated in FIGS. 3-7.

FIG. 3 shows the interior of a furnace module, in this view looking up at the upper portion of a peak firing zone illustrating the inventive lane divider 106 and separate, independently controllable arrays of folded high intensity folded IR lamps 38U for each of Lane A (left side in the figure) and Lane B (right side in the figure). The lamps are folded at their inner end 114 so that two tubes are disposed side by side as double lamps. They are retained in place at their inner end 114 by resting on a quartz cap 110. The outer end of the lamps extend through the respective side walls 32a (left side) and 32b (right side) and terminate in an end fitting 42 extending through apertured plate 68. As the IR lamp tube is folded back on itself, the electrical terminals 48 become disposed side-by-side, and all lamps of the array for each lane in this firing module are accessible from one side of the furnace, as shown.

As shown in FIG. 3 three folded (double) lamps 38 are shown in each lane's lamp array for the exemplary peak firing zone module illustrated, but it should be understood that more or fewer lamps can be employed in such module zones. In addition, the lamps can be powered independently, so that all, or fewer than all, of the lamps in each lane array can be powered, or the power to each lamp adjusted to assist in forming the sharp, short duration peak firing temperature in the firing zone illustrated in FIG. 3. The Arrows A and B represent the direction of travel through the firing zone 16 for each of Lane A and Lane B, respectively. The final burnout zone module 14d, and the quench zone module 18 are shown at the top and bottom of the figure, respectively.

Figure 5:
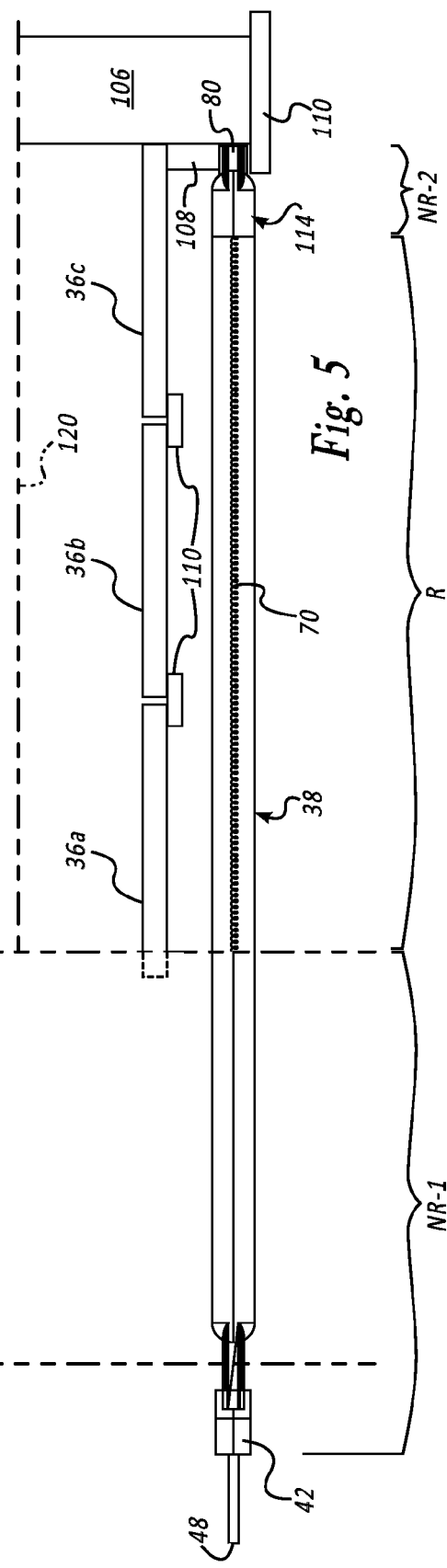
FIG. 5 is a side elevation view of the folded IR lamp of FIG. 4 showing the heated and unheated sections, as well as the folded lamp supported on the center divider and the reflector plate elements supported above the lamps.

In addition, FIGS. 3 and 6 shows that the reflector plate elements 36 are supported spaced above the lamps on quartz strips 110. The reflector plates are rectangular, with their long axis oriented parallel to the center line divider wall. The length of the reflector plates in this embodiment are shorter than the full longitudinal length of this firing zone 16, that is shorter than the distance between the inner faces of the transverse zone end walls 104b and 104c. This provides a small bap 118 to permit flow of air or other special firing atmosphere gases into the furnace processing zone 11 (see FIG. 2) which is defined between the upper reflector plates 36 and the lower ones (not shown) or between the upper ones and the floor of the lower portion of the furnace zone 16L. As best seen in FIG. 5 the inner end of the lamp rests on the cap strip of quartz 110 on the center divider wall 106, and the inner edge of inner reflector plate 36c rests on support block 108 which is secured to the center divider wall 106. The outer reflector plate 36a can similarly rest on a block secured to the outer wall 32 (not shown), or the wall can be notched to receive the plate edge, as shown. The medial support strips 110 are engaged in slots in the respective transverse end walls 104b and 104c respectively (see FIG. 3).

Figure 4:
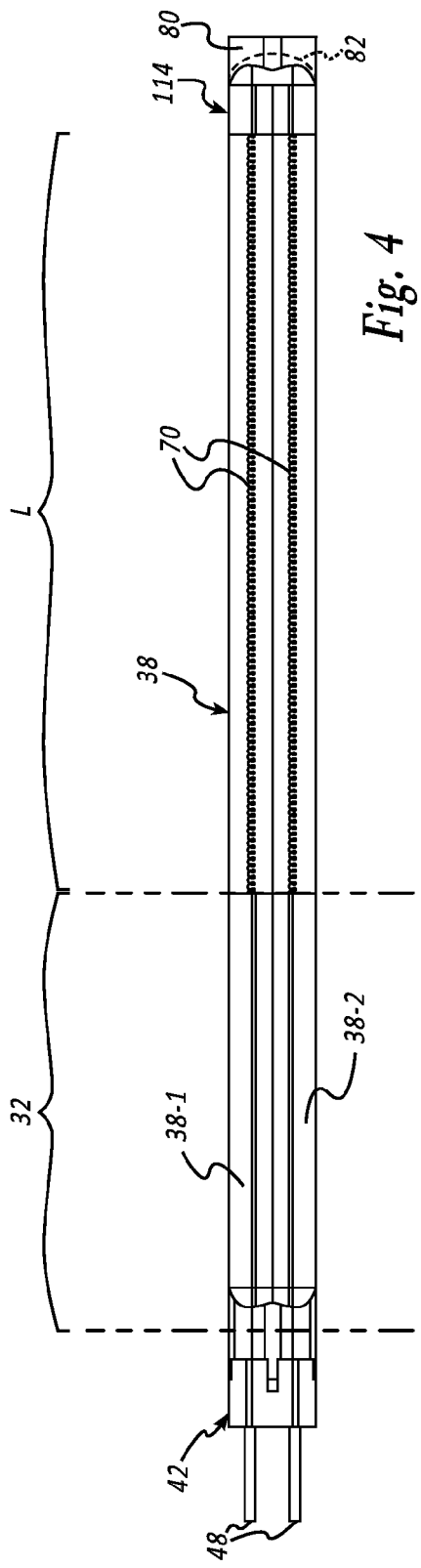
FIG. 4 is a plan view of a folded IR lamp for lane heating and having a fold-end fitting for suspension on the lane divider.

FIGS. 4 and 5 show in top and side elevation views, respectively, a folded IR lamp assembly 38 for lane heating, comprising an inlet tube portion 38-1 and a return tube portion 38-2. In the bent configuration the tubes of each portion are disposed side-by-side and may touch. At the inlet (right end in this figure) the tube bend (the fold) 82 is retained in fitting 114 that terminates at its outer end in a flattened projection 80 so that it can rest on and be retained in place on the block or ledge 108, or on cap strip 110 of the longitudinal lane divider assembly 106. The outer end, that is the end that projects through the side wall 32 of the furnace, terminates in a fitting 42 that leaves the lamp leads 48 exposed for connection to power supply cables (not shown). The inner and outer lamp end fitting elements 114, 42 are typically a ceramic material, such as alumina, but may be made of cordierite or steatite, to support and retain the lamp in proper orientation.

Of the total length of the lamps (before folding), the filament is divided into five sections: a first non-radiant section comprising a straight low resistance lead; a first coiled high resistance radiant section; a second short non-radiant low resistance section; a second coiled high resistance radiant section; and a third non-radiant section. The first and third non-radiant sections terminate in the power leads 48. When the lamp tube is folded, as shown in FIGS. 4 and 5, the first and third non-radiant sections, NR-1 in the figures, are just long enough to project through the side wall 32 of the furnace. The first and second coiled radiant sections are now disposed co-extensive and side by side, R in the figures, having a length L that is wide enough to provide the high intensity IR radiation into the respective lane for which the lamp is installed. The second non-radiant section, NR-2 in the figures, is disposed in the bend 82 at the inner end of the bent-double lamp tube (see FIG. 4), and is covered by the inner end fitting 114.

FIG. 6 shows in detail a transverse cross-section through the peak firing zone module 16, including both the upper section 16U and the lower section 16L. The furnace outer metal shell is shown at 50, the layer of refractory insulation at 52. As shown, lane dividers 106U and 106L are provided disposed at the center line CL 86 of the module, in the upper section 16U and the lower section 16L, respectively. That divides the full width of the conveyor belt 13 into two lanes, left Lane A and right Lane B, respectively, for treatment of wafers 12a and 12b, which are edge-supported on the slanted wings of the belt 13 as shown. The inner end fittings 114, 80 (see FIGS. 4, 5) of the upper lamps 38U rest on the ledge created by the width of the divider cap strip 110 being wider than the divider wall. Those fittings 114, 80 of the lower lamps 38L rest on a block or ledge piece 108 fitted in the divider side wall in each lane. The outer ends of the lamps pass through shaped passages 88 in the respective side walls 32*a* and 32*b*, are retained in place by side plates 68, through which the outer end fittings 42 project. The end leads of each lamp filament 48 are connected to power which is programmed to be controlled by the furnace control system to provide power resulting in a pre-selected thermal profile desired for a given wafer product being transported in the respective Lane A or Lane B.

A thermocouple 112*a* and 112*b* projects down into each Lane A and Lane B into the upper section 16U. The thermocouple sensor wires pass through collimated apertures in the high reflectivity plate 36 disposed above the upper lamps 38U in each lane and terminate between adjacent lamps. As shown in this embodiment, no high reflectivity plate is used below the lower lamps 38L, but it should be understood that such a plate may be used if the process demands. For example, where a process of co-firing of both P and B-doped wafer sides is to be done, a lower reflectance plate may be used. In this embodiment, the reflector plates 36 are oriented with their long axis transverse to the Center Line of the furnace, and rest on ledges or blocks 108 as shown.

As shown in FIGS. 3 and 6, the conveyor transports wafers through the furnace in a longitudinal horizontal path, entering and exiting each successive zone through the conveyor belt gap 58 in each zone's respective end walls 104. FIG. 6 also illustrates the use of air inlet and exhaust manifolds 62, 47, in the upper and lower sections, respectively, for introduction of cooling air or gas 26 and exhaust of heated air.

The example of FIG. 6 shows a full-width conveyor belt fitted with wing wires to support two, side-by-side wafers 12*a* and 12*b* at spaced points along their lower edges, and the peak firing zone 16 divided into two lanes, Lanes A and B, by the centrally-located longitudinal divider assembly 106. However, it should be understood that the conveyor belt may be wide enough to support 3 or more wafers arrayed side-by-side, such that multiple longitudinal dividers may be employed in the selected zone(s) to provide individual heat-treatment zones for each respective wafer lane. Thus this invention includes individual thermal profile control of each of plural side-by-side lanes where wafers are transported on a single belt at a uniform rate. That is, the transport rate for all lanes is the same, but the thermal profile is varied by the lamp power control to produce a selected IR radiation exposure for each lane.

Thus, in a single processing furnace on a single belt, different radiation/heat treatments may be effected, for example on different types of wafers or wafer lines that have been pretreated differently. One line (in one lane) may be metallization firing of a P doped wafer on one type or thickness of substrate, a second line in a different lane may be co-firing front and back of P and B-doped wafers, a third line in a different line may be firing of a wafer doped by a different process or involving a UV pre-treatment, and the like for each of multiple lines. That is, the wafers processed in each line may be the same or different for each lane.

The high reflectance element 36 is typically on the order of ¼" thick for the flat (as shown in FIGS. 3 and 6) or rippled embodiment, but where deep channels, as in FIG. 1C are shown, may be on the order of 2-3 cm thick. The high reflectance element is a high alumina, white ceramic material, having a highly smooth surface and an IR reflectance on the order of above about 95%, preferably 97-99%, withstands temperatures above 2000° F., and is commercially available. Optionally, the high reflectance plate 36 may be is retained in a horizontal slot in the ceiling-mounted divider wall 106U through which the plate is inserted to project equally into both Lane A and Lane B. The lateral extent of the high reflectance plate is longer than the outer edge of the wafer 12*a* and 12*b* being transported in the respective lane.

In an important alternative, the high reflectance alumina ceramic material may be coated onto high temperature ceramic insulation material (e.g., by painting, spraying or slip casting), such as a dense, rigid ceramic fiber board that is commercially available, and fired to vitreous or near-vitreous dense high reflectance coating. In the case of use of channels, the channels may be cast, molded or machined into the board, e.g., by milling, and may thereafter coated with the high reflectance composition and fired.

The longitudinal, horizontal center-to-center, spacing of the lamps can be varied as the process operations require. Thus, not only is there individual power control of the lamps, but their spacing may be varied. Together, they provide the functionality to permit universal and essentially continuous variability in the temperature profile, so that the inventive high reflectance element heating zone module 16 is easily configured to a wide range of industrial processes. Where flat high reflectance plates 36 are used above the upper lamps 38U and optionally below the lower lamps 38L, typically no laminar cooling air is directed along the lamps.

Figure 7:
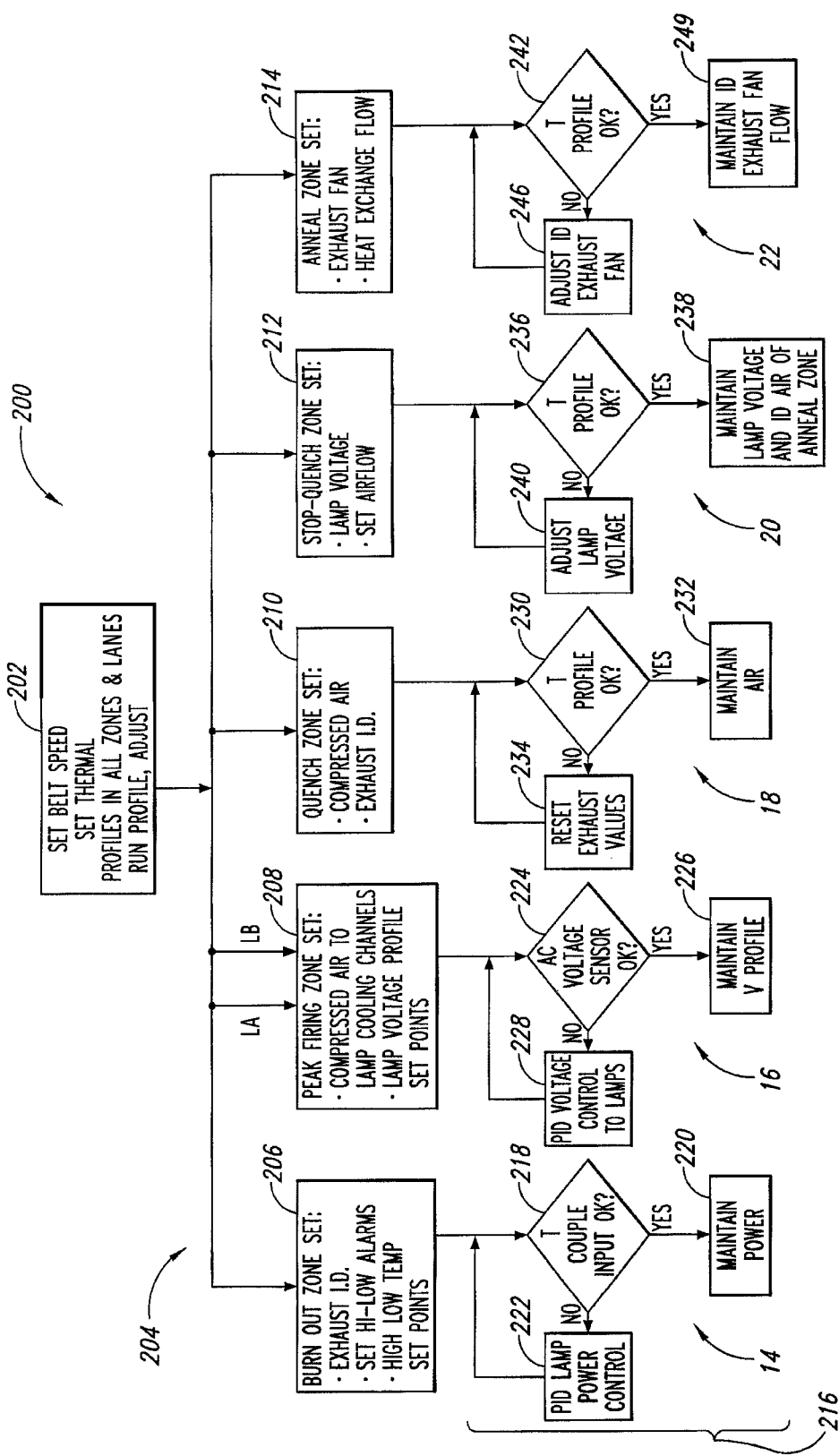
FIG. 7 is a flow sheet of the configuration and method aspects of the inventive process showing control parameters and feed-back loops.

FIG. 7 is a flow sheet showing furnace zone configuration and operational processes of "firing" solar cell wafers or other industrial products that can be processed through the inventive furnace system as shown in FIGS. 1-6. The processes underlying the furnace zone configuration and operation, communications with operators and others, network-implemented management and furnace operation and archival history preserved in one or more databases, as described herein, are typically implemented in software as computer-executable instructions, that upon execution, initiate, monitor and adjust the operations of the furnace system to perform the method of firing illustrated and described herein. The server(s) of the inventive system may be implemented as one or more computers, configured with server software to host a secure, private network, or site on the Internet, to serve static, generally informational pages, and to generate and serve dynamic pages showing arrays of selected files and images, tailored to facilitate the operations and method described herein. The dynamic pages are tailored to individual furnace-operator requirements and may be generated on the fly in response to individual requests from authorized, authenticated users via access devices (desktop and laptop computers, network computers, etc.) which may be Internet linked. The network may be linked to the Internet to enable Internet-implemented management and operation.

The computer(s) of the invention can be configured in a system architecture, for example, as one or more server computer(s), database (e.g., relational, metadata structured and hierarchical) computer(s), storage computer(s), routers, interfaces, and peripheral input and output devices, that together implement the system and network. A computer used in the inventive system typically includes at least one processor and memory coupled to a bus. The bus may be any one or more of any suitable bus structures, including a memory bus or memory controller, peripheral bus, and a processor or local bus using any of a variety of bus architectures and protocols. The memory typically includes volatile memory (e.g., RAM) and fixed and/or removable non-volatile memory. The non-volatile memory can include, but is not limited to, ROM, Flash cards, hard disk drives including drives in RAID arrays, floppy discs, mini-drives, Zip drives, Memory sticks, PCM-CIA cards, tapes, optical drives such as CD-ROM drives, WORM drives, RW-CDROM drives, etc., DVD drives, magneto-optical drives, and the like. The various memory types provide for storage of information and images, including computer-readable instructions, zone configuration templates, templates for configuring individual lamps or groups of lamps, data structures, program modules, operating systems, and other data used by the computer(s).

A network interface is coupled to the bus to provide an interface to the data communication network (LAN, WAN, and/or Internet) for exchange of data among the various site computers, routers, authorized user's/organization's computing devices, and service/product supply vendors for support of the system, and customers, as needed. The system also includes at least one peripheral interface coupled to the bus to provide communication with configured individual peripheral devices, such as keyboards, PDAs, laptops, cell phones, keypads, touch pads, mouse devices, trackballs, scanners, printers, speakers, microphones, memory media readers, writing tablets, cameras, modems, network cards, RF, fiber-optic, and IR transceivers, and the like.

A variety of program modules can be stored in the memory, including OS, server system programs, HSM system programs, application programs, and other program modules and data. In a networked environment, the program modules may be distributed among several computing devices coupled to the network, and used as needed. When a program is executed, the program is at least partially loaded into the computer memory, and contains instructions for implementing the operational, computational, comparative (e.g., sensed signal value of a particular parameter, e.g., temperature, vs the threshold value), archival, sorting, screening, classification, format-ting, rendering, printing and communication functions and processes described herein.

The user, operational data relationships (including history of operations), operational and related types of data are stored in one or more sets of data records, which can be configured as a relational database (or metadata-type, hierarchical, network, or other type of database, as well) in which data records are organized in tables. Such records may be selectively associated with one another pursuant to predetermined and selectable relationships, so that, for example, data records in one table are correlated to corresponding records for the customers in another table and the correlation or individual datum is callable for rendering on screen, printout or other activity pursuant to the inventive method and system.

The system is fully configurable, and a full set of application program templates permits individual authorized, authenticated users to configure each zone operation individually, as described in detail with reference to FIG. 7, as well as receive and store data reports, provide alert(s), and the like. One of skill in this art will easily be able to adapt the inventive multi-zone furnace operation system to the particular needs of a given product IR processing furnace.

As shown in the FIG. 7 flow sheet of furnace operation process 200, an exemplary firing operation, such as shown in Table I above, begins with configuring zones 202 and lanes within a given zone or zones such as Lanes A and B of FIGS. 3 and 6 herein, typically via fill-in templates displayed on a control computer display, to set the belt speed, which is constant in all zones and lanes as the belt is continuous in both length and width through furnace 10 (FIG. 1). Then a thermal profile is configured for all zones 14-22 and individual lanes in zones having multiple lanes, here Lanes A and B of FIGS. 3 and 6, which are respectively pre-selected for a particular advanced material to be fired in the furnace. The pre-selected, pre-set profile(s) is/are checked against an actual run profile (without product) by transporting a thermocouple through the furnace to produce an on-screen profile curve display.

For zone configuration 204 the operations program steps through each zone in turn, starting with the Burn-Out Zone 206 with setting the rate or volume (cfm) of the induced draft exhaust fan, the high and low over-temperature alarm settings, and the high and low temperature set points for the lamps. Each lane, Lanes A and B in the example of FIGS. 3 and 6 above, of the Peak Firing Zone 16 is configured 208, optionally setting the compressed air input to cool the lamps (where used), and selecting the lamp voltage set points (either individually or as to one or more groups of lamps 38U and/or 38L of the arrays in the zone upper and lower sections) to conform to the temperature increase curve required in the peak zone 16 for firing the wafers in each lane. Next, the Quench Zone is configured 210 by setting the compressed air supply to the air knife and exhaust (natural draft or ID fan). The Stop-Quench Zone is configured 212 by setting the lamp voltage, either individually or as a group, and the airflow (which can range from zero to the desired amount to stop the quench). Finally, the Anneal Zone is configured 214 by setting the exhaust induced draft fan and heat exchange tube water flow. Optionally, variable air inlet ports (side and/or bottom walls) can be set.

Upon configuration completion, the furnace operation method 216 is shown in the logic portion of FIG. 7 (reference should also be made to FIG. 1). In the Burn-out Zone 14, thermocouples in the zone output signals representing sensed temperature levels. These are compared 218 to the set points, and if the values are within set parameters, the lamp power is maintained 220. However, if the values do not fall within the set parameters, a PID-type controller adjusts the lamp power 222 until the thermocouples report proper values.

For each individual lane in the peak zone 16, AC voltage sensor signal(s) (or, optionally, thermocouple signals), for each lamp or groups of lamps in each lane, as the case may be, are compared 224, to the set parameters, and if within the selected range, the voltage profile is maintained 226. If the voltage profile of an lane is not maintained, a PID controller adjusts the voltage to the lamp(s) as needed 228 to bring them back to within the profile for that lane. AC Voltage control of the lamp output is preferred to thermocouple control.

In the Quench Zone 18, the temperature is monitored via profiling 230. If within profile, the air flow to the air knife is maintained 232, whereas if not, the exhaust or compressed air values to the air knife are adjusted 234 to bring the temperature to within the pre-selected profile.

In the Stop-Quench Zone 20, the temperature is monitored 236, and if within profile, the lamp voltage and setting of the induced draft fan in the downstream Anneal Zone are maintained 238, whereas if not, the lamp voltage is adjusted 240 to bring the temperature back within profile.

In the Anneal Zone 22, the temperature is monitored at one or more positions along the zone, and if the profile is OK, 242, the exhaust fan setting is maintained 244, whereas if not the air flow of the exhaust fan is adjusted 246 to bring the temperature back within profile. Typically, no lamps or other heat source (other than exhaust gases from the quench and/or stop-quench zone(s)) are provided in this zone.

INDUSTRIAL APPLICABILITY

It is clear that the inventive multi-lane peak firing zone module with use of high reflectance elements has wide applicability to the processing of advanced substrate materials, in that furnace systems fitted with such modules will have substantial processing advantages, namely faster throughput due to the ability to operate the lamps at essentially 100% rated capacity for on the order of 2× or more heating rate without compromising lamp life. In addition, the ability to control individual lanes for different thermal treatment profiles permits a degree of processing flexibility unparalleled in the industry. The inventive, individually and independently controllable multi-lane furnace will become the go-to standard of the industry.

not limited to belt speed, power ramping for selected substrates, peak temperatures, dwell time in spike zones, cool-down rates, cooling air flow rate, heat exchange rate, and the like, and do so on a lane-by-lane basis. This invention, in both its combination and sub-combination aspects is therefore to be defined by the scope of the appended claims as broadly as the prior art will permit, and in view of the specification if need be, including a full range of current and future equivalents thereof.

| Parts List: Provided for convenience during Examination, may be cancelled upon Allowance. | |
|---|---|
| 10 IR Process Furnace | 76 |
| 11 Process zone | 78 |
| 12 Wafers being fired | 80 End piece |
| 13 Conveyer belt | 82 bent end of lamp tube |
| 14 Burn-Out Section | 84 |
| 16 Spike Zone Module | 86 Conveyor Centerline |
| 18 Quench Zone (with air knife) | 88 Ports for IR Lamps in Burn Out zone |
| 20 Quench Stop Zone | 90 Quench Zone Air Knife Assembly |
| 22 Cool-Down Tempering/Anneal Zone | 92 Compressed Air Supply tubes |
| 24 Baffles Entrance/Exit | 94 Planes of Air flow from air knife |
| 26 Cooling Air 27 Plenums | 96 Side Wall air inlets in Anneal zone |
| 28 Exhausts | 98 Heat Exchange lines (water cooled) |
| 30 High reflectance element | 100 ID Draft Fan |
| 32 a, 32b Side Walls | 102 Bottom air inlet ports in Anneal Zone |
| 34U, 34L High reflectance element heating lamp Module | 104 Zone divider walls |
| | 106 Longitudinal dividers |
| 36 High reflectance alumina ceramic plate | 200 Process operational method |
| 38 Folded High Intensity IR lamps | 202 Configure belt & zone T profiles |
| 40 High Intensity IR Heat Lamp | 204 Zone configuration |
| 42 End Fitting | 206 BOZ configuration |
| 44 Bore for Lamp Retainer Fitting | 208 Peak zone configuration |
| 45 Optional Lamp Cooling Air Flow Path | 210 Quench zone configuration |
| 46 Optional Lamp Exhaust Port | 212 Stop-Quench zone configuration |
| 47 Recycle duct hot gas outlets | 214 Anneal zone configuration |
| 48 Electrical Connector for Lamp | 216 Firing method |
| 50 Metal Shell | 218 BOZ thermo-couple reading within limits? |
| 52 Refractory Insulation | 220 Maintain power |
| 53 Flow Baffle | 222 PID controller adjusts power |
| 54 Optional Exhaust Manifold | 224 Peak zone AC voltage reading comparison |
| 55 Port | 226 Maintain V profiles |
| 56 Reflector Channels | 228 PID controller adjusts lamp voltage |
| 58 Conveyor Belt Gap in Zone end walls | 230 Quench zone T profile comparison |
| 60 | 232 Maintain airflow to air knife |
| 62 Inlet Cooling Air Manifold | 234 Reset exhaust or air flow values |
| 64 Highly Reflective Surface | 236 Stop quench T profile comparison |
| 66 | 238 Maintain lamp voltage in zone and fan operation in anneal zone |
| 68 | 240 Adjust lamp voltage |
| 70 Lamp Filament | 242 Anneal zone T profile comparison |
| 72 | 244 Maintain fan operation in zone |
| 74 | 246 Adjust fan air flow to re-establish T profile |
| LA, Lane A | 108 Ledge in divider wall or on outer wall 32a, b |
| LB, Lane B | 110 Cap for divider wall; support for reflectors 36 |
| NR-1 non-radiant section of lamp lead | 112 Thermocouple; 112a for Lane A, 112b for B |
| R Radiant filament section of lamp | 114 Folded lamp inner end fitting (bend end) |
| NR-2 non-radiant section of lamp lead | 118 Gap between reflector plate and end walls 104 |
| CL Center line of furnace | 120 Furnace zone ceiling or floor |

It should be understood that various modifications within the scope of this invention can be made by one of ordinary skill in the art without departing from the spirit thereof and without undue experimentation. For example, a wide range of commercially available heating elements, may be used. Wider belt furnaces may be employed with lane dividers the full length of the furnace, or restricted to selected zones, as desired. For wider belts, the vertical lane dividers may be extended up from the bottom portions of each zone module to support the belt at one or more points across its width, thereby preventing sagging. A PLC controller can be used to provide selectable menus of process parameter control, including but

The invention claimed is:

1. A module for thermal processing furnaces having a single continuous conveyor belt for transporting multiple solar cell wafers in side-by-side relationship lines in a longitudinal process path direction through a plurality of processing zones of said furnace, comprising in operative combination:
   a. an IR lamp heating module divided along a horizontal, generally center line to form an upper and a lower portion, said module being configured to encompass the full lateral width of said conveyor belt with clearance for said conveyor belt to pass there-through, said module portions including end walls coordinately relieved to provide a gap through which said conveyor belt carrying solar cell wafers can pass through in said longitudinal path direction, from and into upstream and downstream zones, respectively, of said furnace;

b. said module includes at least one longitudinally-oriented divider wall disposed to create individual lanes within said module, each of said lanes corresponding to a line of said wafers on said belt, said divider wall terminating short of the horizontal path of said conveyor belt to permit transport clearance thereof;

c. at least one high reflectance alumina ceramic element disposed in at least one lane of at least one of said upper and said lower portion of said module, said high reflectance element having a face directed toward a surface of a wafer being transported on said conveyor belt;

d. at least one high intensity folded tubular IR lamp spaced from said high reflectance element face and intermediate said face and said wafer, said lamp having a tubular length oriented transverse to the longitudinal direction of transport of wafers by said conveyor belt, an interior folded end and side-by-side exterior ends having leads for connection to power; and e. means for retaining said folded tubular lamp in spaced relationship from said high reflectance element to effectively direct high intensity IR radiation from said lamps onto at least one surface of wafers transported through said process zone.

2. A thermal processing furnace module as in claim 1 wherein said conveyor belt is configured to transport pairs of wafers in lines of spaced side-by-side, left and right relationship, and said module includes a divider oriented substantially coordinate with a longitudinal vertical center line of said module to provide two lanes, a left and a right lane corresponding to said left and right wafer lines.

3. A thermal processing furnace module as in claim 2 wherein at least one folded tubular IR lamp is disposed in at least one portion of said module to irradiate each lane of wafers transported through said module.

4. A thermal processing furnace module as in claim 3 wherein said retaining means supports said tubular lamp adjacent its interior folded end.

5. A thermal processing furnace module as in claim 4 wherein said exterior ends of said folded lamp project externally of said module for connection of power thereto from only one side of said furnace.

6. A thermal processing furnace module as in claim 1 wherein said conveyor belt is configured to transport wafers along more than two side-by-side lines, and said module is configured with dividers to create one lane corresponding to each wafer line on said belt.

7. A thermal processing furnace module as in claim 1 wherein power to each lamp in each lane of said module is controlled individually to produce preselected thermal profiles for each said line of wafers being transported through said module on said belt.

8. A thermal processing furnace module as in claim 7 wherein said module includes a thermocouple providing a sensed temperature signal to a furnace controller.

9. A thermal processing furnace module as in claim 4 wherein said retaining means includes a ledge disposed on a side wall of said divider, and said divider is topped with a quartz strip wider than the thickness of said divider.

10. An IR lamp-heated thermal processing furnace having a single continuous conveyor belt for transporting multiple solar cell wafers in side-by-side relationship lines in a longitudinal process path direction through a plurality of processing zones of said furnace, comprising in operative combination:

a. at least one zone of said furnace comprises an IR lamp heating module divided along a horizontal, generally center line to form an upper and a lower portion, said module being configured to encompass the full lateral width of said conveyor belt with clearance for said conveyor belt to pass there-through, said module portions including end walls coordinately relieved to provide a gap through which said conveyor belt carrying solar cell wafers can pass through in said longitudinal path direction, from and into upstream and downstream zones of said furnace, respectively;

b. said module includes at least one longitudinally-oriented divider wall disposed to create individual lanes within said module, each of said lanes corresponding to a line of said wafers on said belt, said divider wall terminating short of the horizontal path of said conveyor belt to permit transport clearance thereof;

c. at least one high reflectance alumina ceramic element disposed in at least one lane of at least one of said upper and said lower portion of said module, said high reflectance element having a face directed toward a surface of a wafer being transported on said conveyor belt;

d. at least one high intensity folded tubular IR lamp spaced from said high reflectance element face and intermediate said face and said wafer, said lamp having a tubular length oriented transverse to the longitudinal direction of transport of wafers by said conveyor belt, an interior folded end and side-by-side exterior ends having leads for connection to power; and e. means for retaining said folded tubular lamp in spaced relationship from said high reflectance element to effectively direct high intensity IR radiation from said lamps onto at least one surface of wafers transported through said process zone.

11. An IR lamp-heated processing furnace as in claim 8 wherein said multi-lane module is provided for a spike firing zone.

12. An IR lamp-heated processing furnace as in claim 11 which includes upstream of said spike firing zone, at least one of a burn-out zone and a drying zone.

13. An IR lamp-heated processing furnace as in claim 11 which includes a tempering zone downstream of said spike firing zone.

14. An IR lamp-heated processing furnace as in claim 11 wherein said furnace includes at least one of a quench zone and a stop-quench zone intermediate between said spike firing zone and said tempering zone.

15. An IR lamp-heated processing furnace as in claim 14 wherein said quench zone includes at least one air knife assembly for rapidly reducing the temperature of product on said conveyor belt as it exits said spike firing zone, and wherein said stop-quench zone includes at least one IR lamp to stop the cooling of said product in preparation for tempering in said tempering zone.

16. An IR lamp-heated processing furnace as in claim 10 which includes a controller for controlling the rate of travel of said conveyor belt and the power to each of said IR lamps in each lane of said spike firing zone module to provide a selectable thermal heating profile throughout the zones of said furnace.

17. A method of thermal processing solar cell wafers in IR lamp-heated furnaces having a single continuous conveyor belt for transporting multiple solar cell wafers in side-by-side relationship lines in a longitudinal process path direction through a plurality of processing zones of said furnace, comprising the steps of:

a. providing at least one zone of said furnace with an IR lamp heating module divided along a horizontal, generally center line to form an upper and a lower portion, said module being configured to encompass the full lateral width of said conveyor belt with clearance for said conveyor belt to pass there-through, said module portions including end walls coordinately relieved to provide a gap through which said conveyor belt carrying solar cell wafers can pass through in said longitudinal path direction, from and into upstream and downstream zones of said furnace, respectively;

b. providing in said module at least one longitudinally-oriented divider wall to create individual lanes within said module, each of said lanes corresponding to a line of said wafers on said belt, said divider wall terminating short of the horizontal path of said conveyor belt to permit transport clearance thereof;

c. providing at least one high reflectance alumina ceramic element in at least one lane of at least one of said upper and said lower portion of said module, said high reflectance element having a face directed toward a surface of a wafer being transported on said conveyor belt;

d. providing at least one high intensity folded tubular IR lamp spaced from said high reflectance element face and intermediate said face and said wafer, said lamp having a tubular length oriented transverse to the longitudinal direction of transport of wafers by said conveyor belt, and said lamp having an interior folded end and side-by-side exterior ends having leads for connection to power;

e. retaining said folded tubular lamp in spaced relationship from said high reflectance element to effectively direct high intensity IR radiation from said lamps onto at least one surface of wafers transported through said process zone; and f. controlling the rate of travel of said conveyor belt and the power to each of said IR lamps in each lane of said module to produce a selectable thermal heating profile throughout the zones of said furnace.

18. A method of solar cell processing as in claim 17 which includes the steps of providing said conveyor belt configured to transport pairs of wafers in lines of spaced side-by-side, left and right relationship, and providing said module configured with a single divider oriented substantially coordinate with a longitudinal vertical center line of said module to have two lanes, a left and a right lane, corresponding to said left and right wafer lines.

19. A method of solar cell processing as in claim 18 which includes the step of providing at least one folded tubular IR lamp in at least one portion of said module to irradiate each lane of wafers transported through said module.

20. A method of solar cell processing as in claim 19 which includes the step of providing a sensed temperature signal from said module as input to said controlling step.

* * * * *